(12) United States Patent
Chen et al.

(10) Patent No.: US 10,468,249 B2
(45) Date of Patent: *Nov. 5, 2019

(54) PATTERNING PROCESS OF A SEMICONDUCTOR STRUCTURE WITH A MIDDLE LAYER (71) Applicant: Taiwan Semiconductor Manufacturing Company, Ltd., Hsin-Chu (TW)

(72) Inventors: Chien-Chih Chen, Taipei (TW); Chien-Wei Wang, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 92 days.

This patent is subject to a terminal disclaimer.

(21) Appl. No.: 14/868,043

(22) Filed: Sep. 28, 2015

(65) Prior Publication Data
US 2017/0092495 A1    Mar. 30, 2017

(51) Int. Cl.
H01L 21/033    (2006.01)
H01L 21/027    (2006.01)
G03F 7/09      (2006.01)

(52) U.S. Cl.
CPC .......... *H01L 21/0337* (2013.01); *G03F 7/091* (2013.01); *G03F 7/094* (2013.01); *H01L 21/0271* (2013.01); *H01L 21/0273* (2013.01)

(58) Field of Classification Search
CPC .. H01L 21/0337; H01L 21/0271; G03F 7/091
See application file for complete search history.

(56) References Cited

U.S. PATENT DOCUMENTS

| | | | |
|---|---|---|---|
| 5,849,465 A | 12/1998 | Uchida et al. | |
| 8,628,897 B1 | 1/2014 | Lu et al. | |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,704,711 B2 * | 7/2017 | Liu | H01L 21/0271 |
| 2011/0045404 A1 * | 2/2011 | Imamura | C08G 77/60 430/270.1 |
| 2013/0210229 A1 | 8/2013 | Ogihara et al. | |
| 2014/0272709 A1 * | 9/2014 | Liu | G03F 7/092 430/272.1 |

* cited by examiner

Primary Examiner — Daborah Chacko-Davis
(74) Attorney, Agent, or Firm — Haynes and Boone, LLP (57) ABSTRACT A lithography method is provided in accordance with some embodiments. The lithography method includes forming a metal-containing layer on a substrate, the metal-containing layer including a plurality of conjugates of metal-hydroxyl groups; treating the metal-containing layer at temperature that is lower than about 300° C. thereby causing a condensation reaction involving the plurality of conjugates of metal-hydroxyl groups; forming a patterned photosensitive layer on the treated metal-containing layer; and developing the patterned photosensitive layer so as to allow at least about 6% decrease of optimum exposure ($E_{op}$).

20 Claims, 10 Drawing Sheets

PATTERNING PROCESS OF A SEMICONDUCTOR STRUCTURE WITH A MIDDLE LAYER

BACKGROUND

In integrated circuit (IC) fabrications, a patterned photoresist layer is used to transfer a designed pattern having small feature sizes from a photomask to a wafer. The photoresist is light-sensitive and can be patterned by a photolithography process. Furthermore, the photoresist layer provides resistance to etch or ion implantation, which further requires a sufficient thickness. When IC technologies are continually progressing to smaller feature sizes, for example, down to 32 nanometers, 28 nanometers, 20 nanometers and below, the thickness is not scaled down accordingly because of the resistance requirement. Depth of focus sufficient enough to cover the thicker photoresist degrades the imaging resolution. Multiple-film photoresist is introduced to overcome the above challenge. However, while a variety of such multiple-film photoresists have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As lithographic features are reduced, for example, to below 40 nanometers (nm), high numerical aperture processes are needed to overcome the resolution limit. The use of a multiple-film photoresist (e.g., trilayer photoresist stack) appears to be promising in this regard. Specifically, trilayer photoresist stack may provide for improvements in pattern transfer, line edge roughness (LER), and line width roughness (LWR) among other benefits. In general, such a trilayer photoresist stack includes an under layer, a middle layer over the under layer, and a photoresist layer over the middle layer. Conventionally, the under layer and/or the middle layer of the trilayer stack may contain silicon. The silicon-containing under layer and/or middle layer have demonstrated good reflectivity control and reasonable etch selectivity. Moreover, for a trilayer photoresist stack to be used in an extreme ultraviolet lithography (EUVL), a metal-containing middle layer may be used. Such a metal-containing middle layer (e.g., a hardmask layer) absorbs EUV wavelengths, so that using the metal-containing hardmask layer may provide increased sensitivity of a EUV photoresist that is formed over the metal-containing middle layer. However, a variety of issues may occur especially at the interface of the metal-containing middle layer and the EUV photoresist such as for example, one or more conjugates of metal-hydroxyl groups formed on the surface of the metal-containing hardmask layer (i.e., the interface between the EUV photoresist and the hardmask layer). Usually, such conjugates of metal-hydroxyl groups formed at the interface may in turn result in undesirably formed pattern of the photoresist (e.g., an undercut profile and/or a footing profile of the photoresist). Thus, the present disclosure provides methods to treat such metal-containing hardmask layers thereby providing an improved interface between a hardmask layer and an overlaying photoresist.

Figure 1:
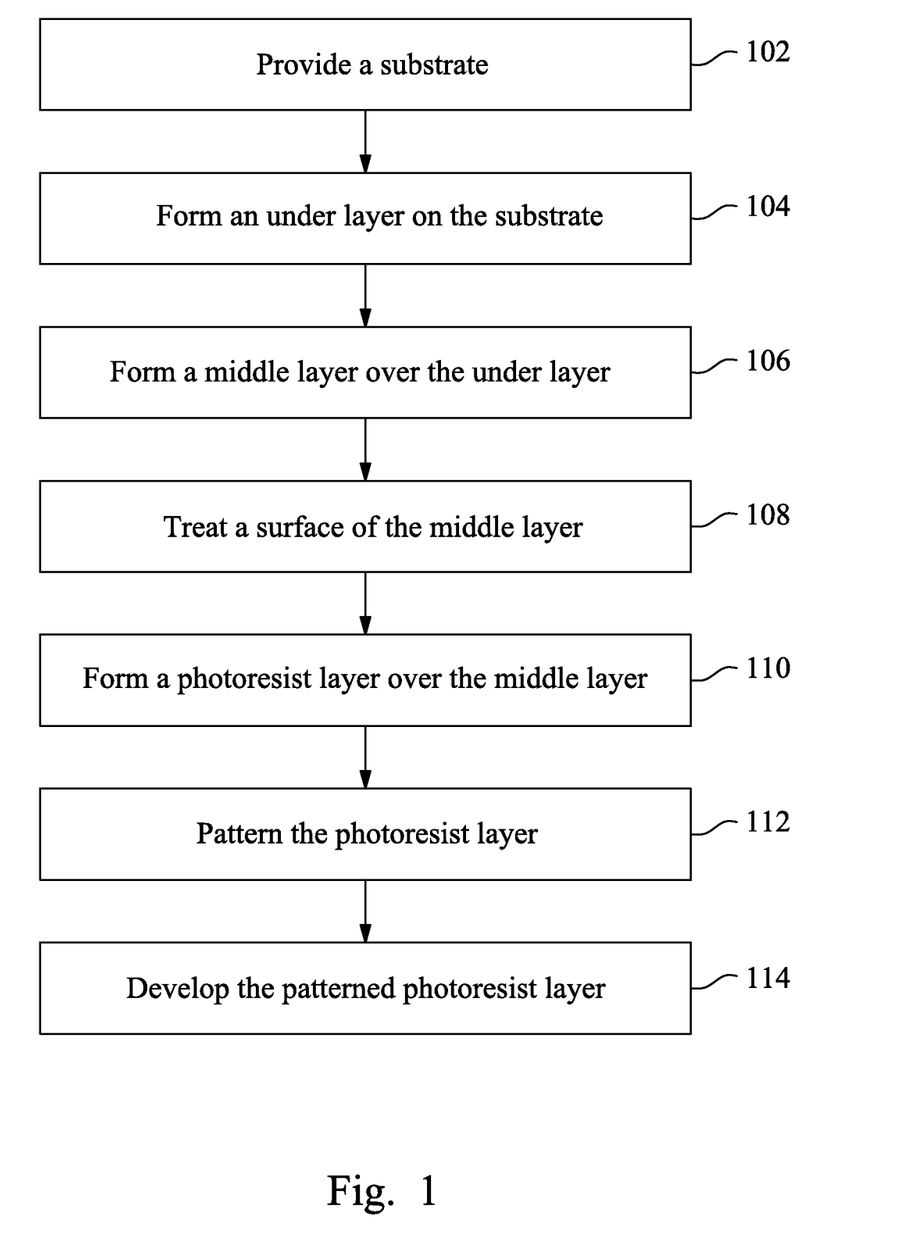
FIG. 1 illustrates a method for fabricating a semiconductor device using a trilayer photoresist in accordance with various embodiments.

FIG. 1 is a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, and/or other lithography processes to improve pattern dimension accuracy. In the present embodiment, EUV and/or e-beam lithography is used as the primary example. Additional operations can be provided before, during, and after the method 100, and some operations described can be replaced, eliminated, or moved around for additional embodiments of the method.

The method 100 is described below in conjunction with FIGS. 2A, 2B, 2C, 2D, 2E, 2F, 2G wherein a semiconductor device 200 is fabricated by using embodiments of the method 100. The semiconductor device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and/or combinations thereof.

Figure 2A:
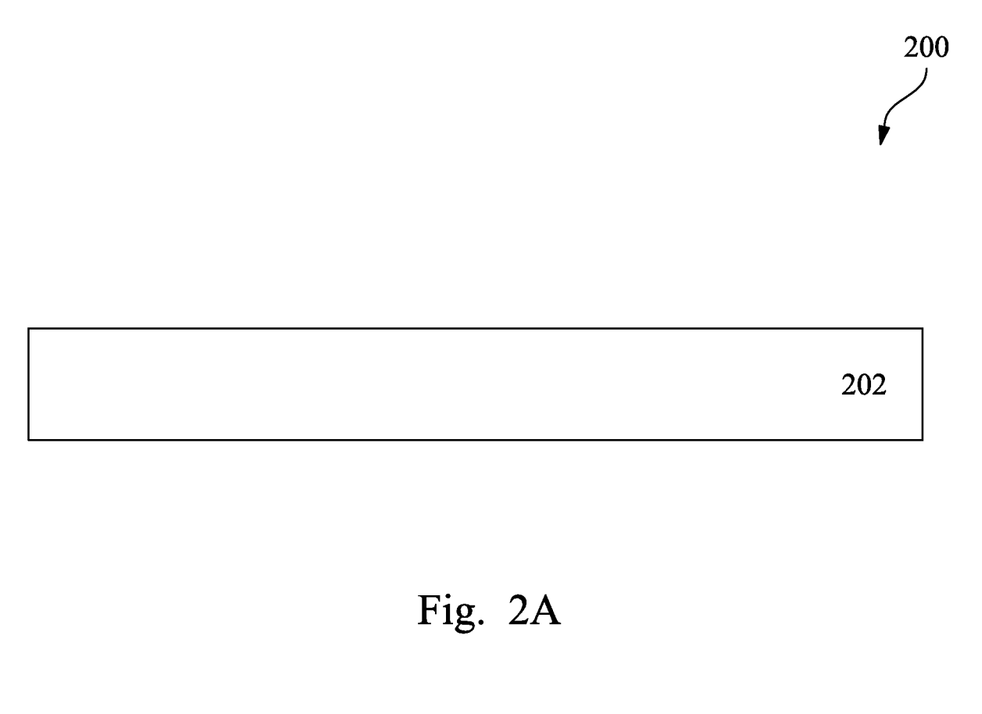
FIGS. 2A through 2G illustrate sectional views of one exemplary semiconductor structure at various fabrication stages, constructed in accordance with some embodiments.

Referring now to FIG. 1 in conjunction with FIG. 2A, the method 100 begins with operation 102 in which a substrate 202 of a semiconductor device 200 is provided. The semiconductor device 200 is a semiconductor wafer in the present embodiment. The semiconductor device 200 includes a semiconductor substrate 202, such as a silicon substrate in some embodiments. The substrate 202 may include another elementary semiconductor, such as germanium, or diamond in some embodiments. The substrate 202 may include a compound semiconductor, such as silicon carbide, gallium arsenic, indium arsenide, and indium phosphide. The substrate 202 may include an alloy semiconductor, such as silicon germanium, silicon germanium carbide, gallium arsenic phosphide, and gallium indium phosphide. The substrate 202 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 202 may include a semiconductor-on-insulator (SOI) structure. For examples, the substrate may include a buried oxide (BOX) layer formed by a process such as separation by implanted oxygen (SIMOX). In other embodiments, the substrate 202 may include a glass such as in thin film transistor (TFT) technologies.

Figure 2B:
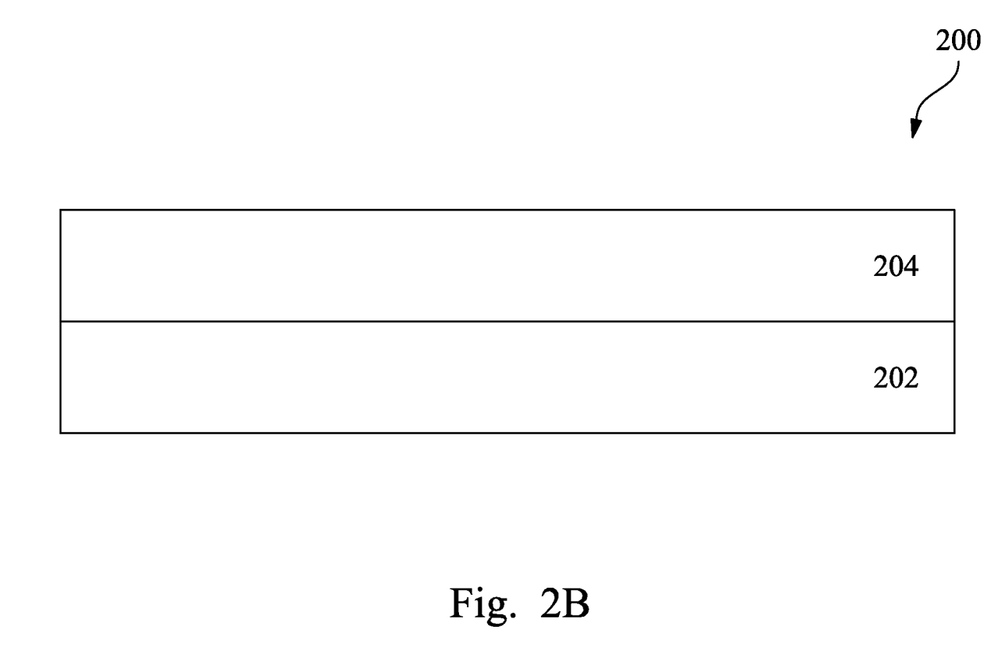

Referring to FIG. 2B, method 100 proceeds to operation 104 with forming an underlayer (or material layer) 204 over the substrate 202. The semiconductor device 200 may also include other material layers and other circuit patterns. For example, the semiconductor device 200 may include various doped features, such as doped well structure (e.g., a P-typed doped well and an N-type doped well) formed in the semiconductor substrate 202. In other embodiments, the semiconductor device 200 may further include one or more material layers to be patterned (by etching to remove or ion implantation to introduce dopants), such as a dielectric layer to be patterned to form trenches for conductive lines or holes for contacts or vias; a gate material stack to be patterned to form gates; and/or a semiconductor material to be patterned to form isolation trenches. In other embodiments, multiple semiconductor material layers, such as gallium arsenic (GaAs) and aluminum gallium arsenic (AlGaAs), are epitaxially grown on the semiconductor substrate and are patterned to form various devices, such as light-emitting diodes (LEDs). In some other embodiments, the semiconductor device 200 includes fin active regions and three dimensional fin field-effect transistors (FinFETs) formed or to be formed thereon. The underlayer 204 is configured to provide resistance to etching or ion implantation. The underlayer 204 functions as a mask to protect the substrate 202 from etching or ion implantation. Accordingly, the underlayer 202 has a sufficient thickness in this regard. In some embodiments, the underlayer 202 includes an organic polymer free of silicon. In some embodiments, the forming the under layer 202 (i.e., operation 104) includes spin-on coating and curing (such as a thermal baking process with a proper baking temperature).

Figure 2C:
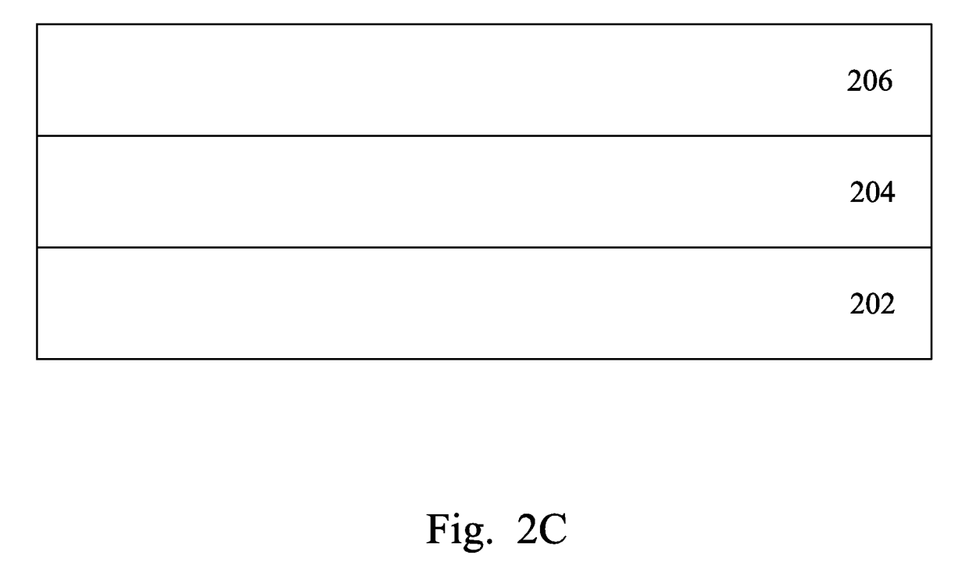
Figure 2D:
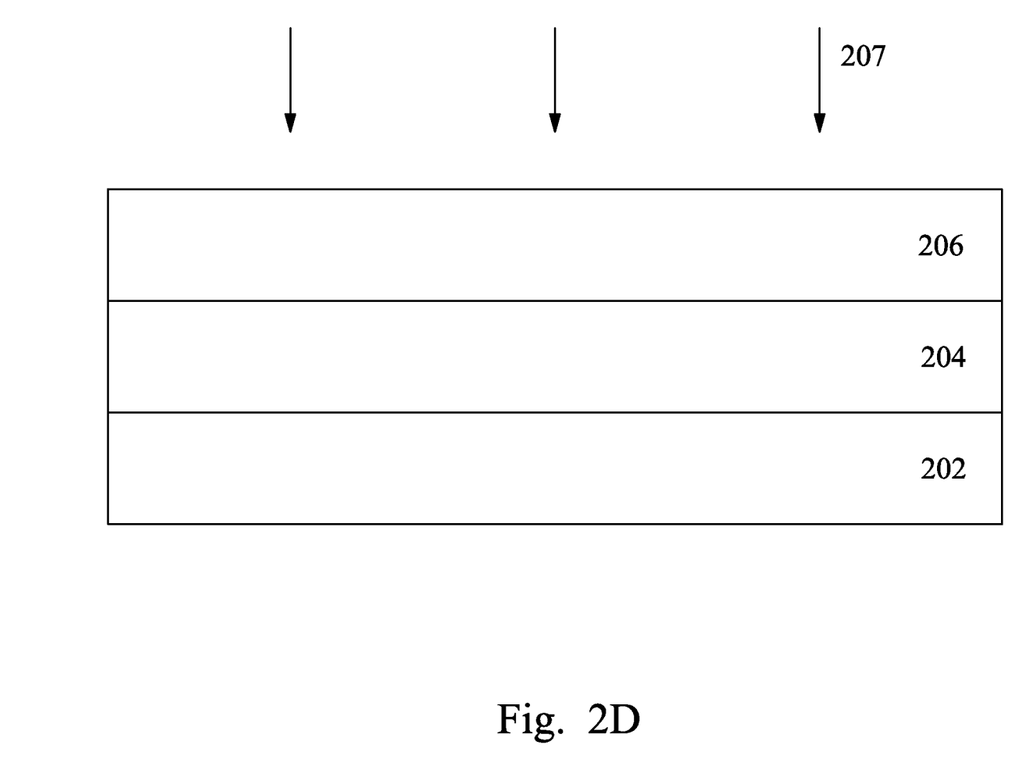

Referring to FIG. 2C, method 100 then continues to operation 106 with forming a hardmask layer 206 (or metal-containing layer) over the underlayer 204. Hardmask layer 206 is a silicon-based and metal-containing layer so as to provide etch selectivity from the underlayer 204. Furthermore, hardmask layer 206 provides increased sensitivity to EUV light to a overlaying photoresist layer. In some other embodiments, hardmask layer 206 is designed to function as a bottom anti-reflective coating that reduces reflection during a lithography exposure process, thereby increasing the imaging contrast and enhancing the imaging resolution. In some alternative embodiments, hardmask layer 206 is formed over a underlayer 204 that is free of silicon (i.e. a silicon-free underlayer 202) to enhance etching selectivity between the layers. In some embodiments, forming the hardmask layer 206 includes spin-on coating and curing (such as a thermal baking process with a suitable baking temperature).

The present disclosure provides various embodiments of hardmask layer 206. In an embodiment, hardmask layer 206 is a metal-containing silicon-based hardmask. Such metal-containing silicon-based hardmask 206 may be formed of any combination selected from a group consisting of: a silicon-containing polymer, a metalline polymer, an organic polymer, a metalorganic polymer, a crosslinker, a chromophore, a photo acid generator (PAG), a quencher, a fluoro additive, and a solvent. Examples of the metal composition of the hardmask 206 may include Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, Sn, Pb, Sb, Ca, Ba, and/or Bi. In addition, the hardmask 206 may further include a non-metallic catalyst and a metallic catalyst in accordance with various embodiments. Regarding the catalysts, example of the metallic catalysts may include organometallic with organic ligands, metal oxide, metal nitride, and/or metal sulfide. Embodiments of the non-metallic catalysts may include acids, bases, and ionic salts such as for example, hydrogen chloride, sulfonic acid, acetic acid, amine, and/or ammonium salt. By including such catalysts in the formed hardmask layer 206, a conjugation of metal-hydroxyl groups within and/or on a surface of the hardmask layer 206 may be reduced via a condensation reaction on the conjugation of metal-hydroxyl groups. Details of the catalysts for reducing a conjugation of metal-hydroxyl groups is discussed below.

In another embodiment, the metal-containing silicon-based hardmask layer 206 may further include additives such as capping agent(s) and/or chelating ligand(s). The additive may be blended with the silicon-containing polymer, the metalline polymer, the organic polymer, and/or the metalorganic polymer that are used to form the metal-containing silicon-based hardmask 206. Such additives may be configured to passivate/cover free hydroxyl groups within and/or on the surface of the hardmask layer 206 thereby reducing the conjugation of metal-hydroxyl groups within and/or on a surface of the hardmask layer 206.

In accordance with an embodiment, the additive may include at least one of the functional groups: alcohol, diol, thiol, dithiol, ethylenediaminetetraacetic acid (EDTA), amine, phosphine, alkene, alkyne, —I, —Br, —Cl, —NH2, —COOH, —OH, —SH, —N3, —S(=O)—, imine, vinyl ether, acetal, hemiacetal, ester, aldehyde, ketone, amide, sulfone, acetic acid, cyanide, and/or allene. Some specific examples of the capping agent may be represented as:

Similarly, some specific examples of the chelating ligand may be represented as:

More specifically, the chelating ligand may be in a variety of compositions and/or forms such as for example, M-OR, M-OOCR, M-OC(=O)OR, M-Cl, M-Br, M-NR3, M-CN, M-SR, M-C(=O)R, M-N(R)—C(=O)R, M-CR=CRR, M-R, EDTA, a bidentate ligand, a tridentate ligand, a hexadentate ligand, a polydentate ligand, wherein M represents a metal atom coordinated with the chelating ligand.

Figure 2E:
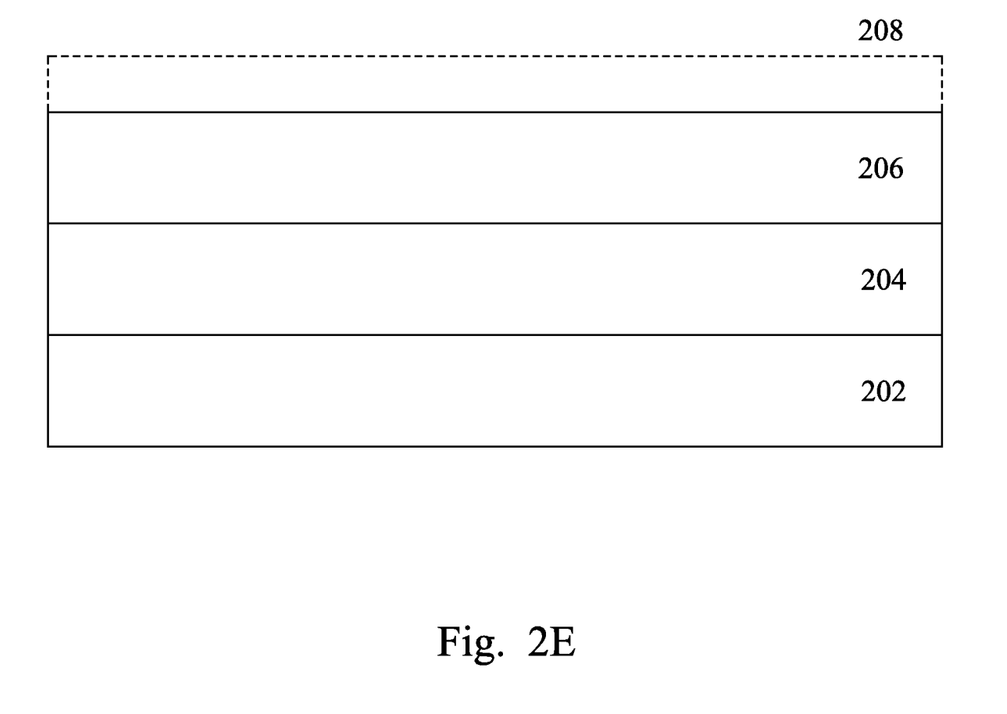

The method 100 proceeds to operation 108 with treating (207 in FIG. 2D) the metal-containing silicon-based hardmask layer 206 so as to form a treated hardmask layer 206' in accordance with various embodiments. A variety of approaches may be used to treat the hardmask 206. In an embodiment, treating the hardmask 206 may include baking the semiconductor device 200 in temperature ranging from about 100° C. to about 300° C. In the example in which the hardmask 206 includes the metallic and/or the non-metallic catalysts, after the treating (i.e., operation 108 in FIGS. 1 and 207 in FIG. 2D), the catalyst may induce a condensation reaction on at least two conjugates of the metal-hydroxyl groups within or on the surface of the hardmask 206. On the other hand, in the example in which the additive (e.g., the capping agent and/or the chelating ligand) is blended into the composition to form the hardmask 206, a variety of chemical reactions (e.g., a replacement reaction, a condensation reaction, a $S_N2$ reaction, a $S_N1$ reaction, an E1 reaction, an E2 reaction, an oxidation reaction, a reduction reaction, a cycloaddition reaction, an elimination reaction, and a crosslinking reaction) may occur on the conjugates of the metal-hydroxyl groups within or on the surface of the hardmask 206. In a specific embodiment, the chemical reaction induced by the capping agent and/or the chelating ligand may include passivate/cover free hydroxyl groups on the surface of the hardmask 206. Moreover, the functional groups (e.g., alcohol, diol, thiol, dithiol, ethylenediaminetetraacetic acid (EDTA), amine, phosphine, alkene, alkyne, —I, —Br, —Cl, —NH2, —COOH, —OH, —SH, —N3, —S(=O)—, imine, vinyl ether, acetal, hemiacetal, ester, aldehyde, ketone, amide, sulfone, acetic acid, cyanide, ketene, isocyanate, and allene) of the capping agent and/or the chelating ligand may be configured to induce the above-mentioned chemical reactions. Alternatively or additionally, in another embodiment, treating the hardmask 206 may include forming a passivation layer 208 over the hardmask 206 (FIG. 2E). In a specific embodiment, the passivation layer may be a polymeric layer formed on the surface of the hardmask 206 wherein the polymeric layer includes Polyhydroxystyrene (PHS), methacrylate, polyether, silicon-containing polymers, organic polymers containing aromatic rings, or a combination hereof. According to the current embodiment, a thickness of the passivation layer 208 may be ⅙ the thickness of the hardmask 206. Yet in another embodiment, the treating the hardmask 206 may include modifying the surface of the hardmask 206 using a variety of compositions such as for example, HMDS, diols, alcohols, organometallic with organic ligands, metal oxide, metal nitride, and/or metal sulfide. Furthermore, such a variety of compositions may be applied to the surface of the hardmask 206 and a baking step may be followed so as to reduce free hydroxyl groups on the surface of the hardmask 206.

Figure 3:
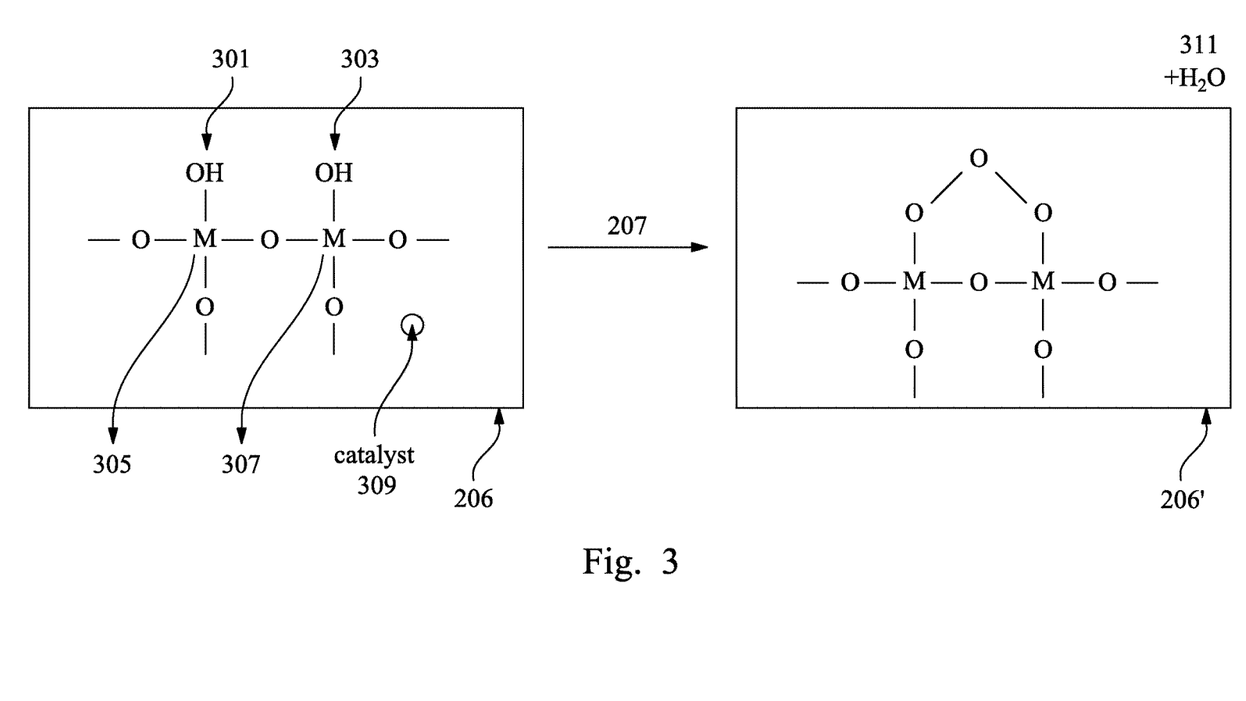
FIG. 3 illustrates an example of a chemical reaction of a treatment to a hardmask, constructed according to aspects of the present disclosure in some embodiments.

Referring now to FIG. 3, an example of the condensation reaction induced by the catalyst is illustrated. As shown in FIG. 3, two free hydroxyl groups 301 and 303 ("—OH") are formed and bonded to the metal(s) ("M") 305 and 307 of the hardmask 206. After the treating step 207 (operation 108), the catalyst 309 may induce a condensation reaction to remove the free hydroxyl groups to form treated hardmask 206'. More specifically, the condensation reaction may include combining one hydroxide from one of the free hydroxyl groups and one hydrogen from the other free hydroxyl group to form water 311.

Figure 4:
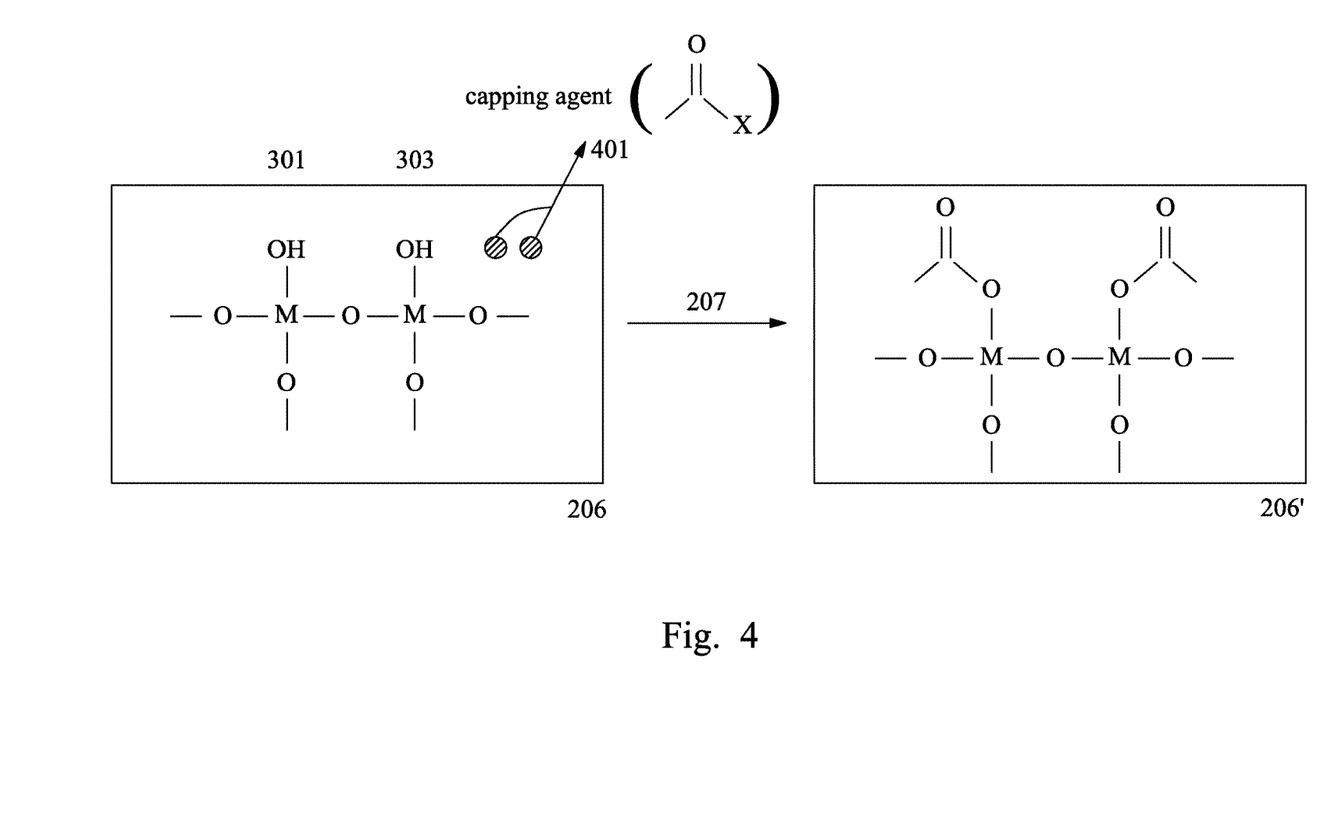
FIG. 4 illustrates an example of a chemical reaction of a treatment to a hardmask, constructed according to aspects of the present disclosure in some embodiments.

Referring now to FIG. 4, an example of a reaction induced by the capping agent 401 is illustrated. As shown in, the capping agent 401 is configured to react with each of the free hydroxyl groups 301 and 303 of the hardmask 206 so as to form a passivated/treated hardmask 206' (i.e., free of free hydroxyl groups as shown in FIG. 4).

Figure 2F:
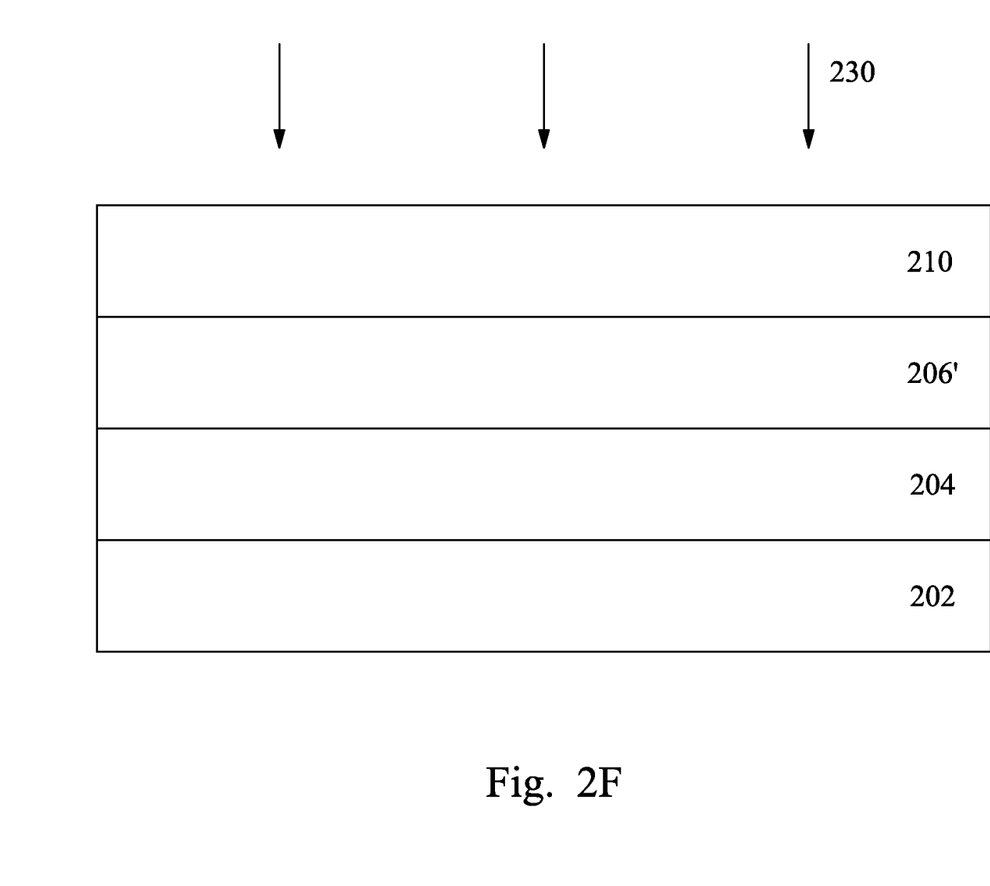

Referring to FIG. 2F, method 100 proceeds to operation 110 with forming a material layer 210 over the treated hardmask 206'. In an embodiment, the material layer 210 is formed by spin-on coating a liquid polymeric material onto the treated hardmask 206'. In an embodiment, the material layer 210 is further treated with a soft baking process and a hard baking process. In an embodiment, the material layer 210 is a radiation sensitive layer, such as a photoresist including an I-line resist, a DUV resist including a krypton fluoride (KrF) resist and argon fluoride (ArF) resist, a EUV resist, an electron beam (e-beam) resist, and an ion beam resist. In the present embodiment, the material layer 210 is a resist sensitive to EUV radiation.

The method 100 proceeds to operation 112 by exposing the photoresist 210 to a radiation beam 230 in a lithography system, as shown in FIG. 2F. The radiation beam may be an I-line (365 nm), a DUV radiation such as KrF excimer laser (248 nm) or ArF excimer laser (193 nm), a EUV radiation (e.g., 13.5 nm), an e-beam, an x-ray, an ion beam, and/or other suitable radiations. Operation 112 may be performed in air, in a liquid (immersion lithography), and/or in a vacuum (e.g., for EUV lithography and e-beam lithography). In an embodiment, the radiation beam is patterned with a mask, such as a transmissive mask or a reflective mask, which may include resolution enhancement techniques such as phase-shifting and/or optical proximity correction (OPC). In another embodiment, the radiation beam is directly modulated with a predefined pattern, such as an IC layout, without using a mask (maskless lithography). In the present embodiment, the radiation beam is a EUV radiation and the operation 112 is performed in a EUV lithography system, such as the EUV lithography system.

Still referring to operation 112, after the exposure, the operation 112 may further include a treatment process. An example of such treatment processes may include baking the substrate 202.

Figure 2G:
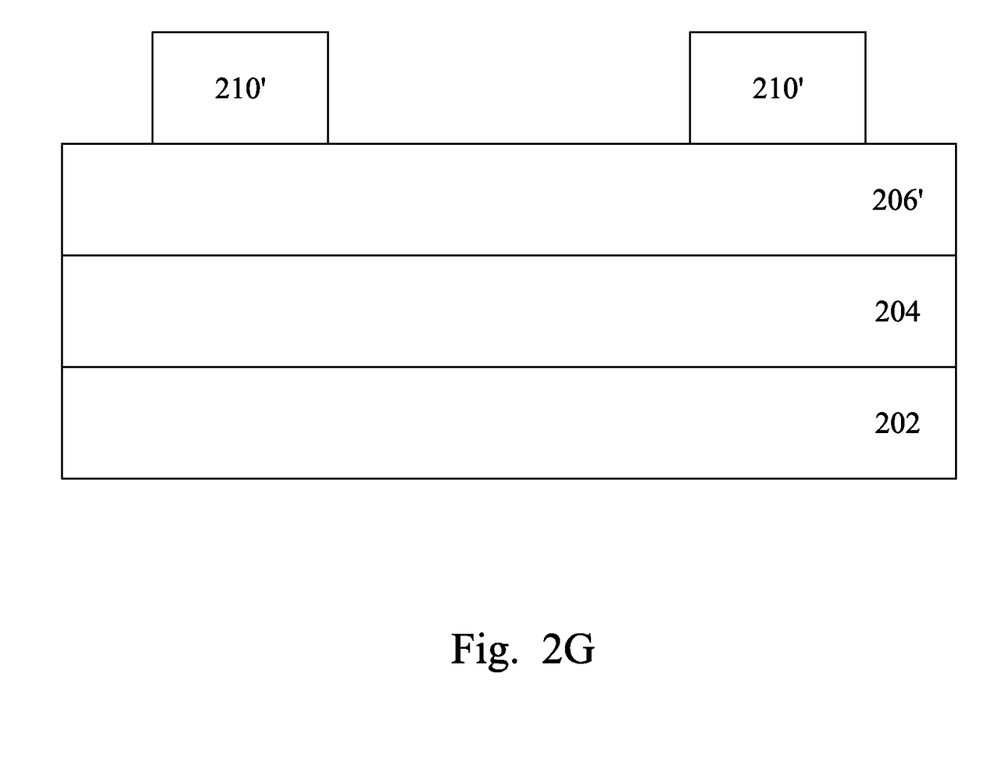

The method 100 then proceeds to operation 114 by developing the exposed photoresist 210 in a developer as shown in FIG. 2G. In an embodiment, the developer may be a positive tone developer that dissolves and removes exposed portions of the photoresist 210 or a negative tone developer that selectively dissolves and removes the unexposed areas of the photoresist 210 as well as the under-exposed areas of the photoresist 210, thereby forming a patterned photoresist 210'. In the example as shown in FIG. 2G, the patterned photoresist 210' are represented by two line patterns. However, the following discussion is equally applicable to resist patterns represented by trenches. By using the current embodiments of the hardmask layer 206, a variety of improvements of the developed photoresist 210 may be provided such as, for example, sensitivity of the photoresist 210, reflectivity of the photoresist, and other characteristic of the photoresist 210 known in the art. In an example, for the hardmask layer 206 that includes aluminum oxide ($Al_2O_3$), an optimum exposure ($E_{op}$) may be decreased to about 11 mJ while an $E_{op}$ of about 13 mJ may be required with a conventional hardmask layer. That is, about 15% decrease of $E_{op}$ may be provided. In another example in which the hardmask layer 206 includes germanium (Ge), an optimum exposure ($E_{op}$) may be decreased to about 16 mJ while an $E_{op}$ of about 17 mJ may be required with a conventional hardmask layer. That is, about 6% decrease of $E_{op}$ may be provided.

The method 100 may proceed to forming a final pattern and/or an IC device on the substrate 202. For example, method 100 proceeds to one or more further operations to etch the substrate 202 using the patterned photoresist 210' as an etch mask, thereby transferring the pattern from the patterned photoresist 210' to the treated hardmask 206', the underlayer 204, and/or the substrate 202.

The present disclosure provides a lithography method for fabricating a semiconductor device. More specifically, the currently disclosed method is directed to fabricating a semiconductor device using a multi-layer photoresist stack (e.g., a trilayer photoresist stack). As mentioned above, a conventional trilayer photoresist stack uses silicon-containing middle layer as a hardmask, and in a further embodiment of using a trilayer photoresist in a EUVL, a metal-containing silicon-based hardmask is employed in order to enhance sensitivity of the trilayer photoresist to EUV light. However, in such a trilayer photoresist stack with a metal-containing silicon-based hardmask, issues such as interface degradation between a hardmask and a photoresist may arise. Conventionally, such issues may be resolved by baking the substrate/hardmask in temperature generally higher than about 400° C. In turn, baking the substrate in such high temperature, other issues (e.g., contamination) may arise. Thus, the present disclosure provides various embodiments to provide an improved hardmask and/or a passivated surface of a hardmask of a multi-layer photoresist stack. As such, the interface between a hardmask and a photoresist may not be subjected to the above-mentioned issues. Moreover, by using the presently disclosed embodiments, high baking temperature that is conventionally required to passivate a hardmask surface is not needed. In accordance with the current embodiments, baking the disclosed hardmask at temperature between about 100° C. and about 300° C. may be sufficient to cause the metal-containing silicon-based hardmask to avoid the issue (e.g., interface degradation between the hardmask and a coupled photoresist). As such, the coupled photoresist may be more sensitive to a radiation source (e.g., EUV radiation source), which means that the coupled photoresist may only require lower exposure energy (e.g., decrease of optimum exposure ($E_{op}$)) to be patterned/developed. Accordingly, a more flexible lithography method may be provided.

A lithography method is provided in accordance with some embodiments. The lithography method includes forming a metal-containing layer on a substrate, the metal-containing layer including a plurality of conjugates of metal-hydroxyl groups; treating the metal-containing layer at temperature that is lower than about 300° C. thereby causing a condensation reaction involving the plurality of conjugates of metal-hydroxyl groups; forming a patterned photosensitive layer on the treated metal-containing layer; and developing the patterned photosensitive layer so as to allow at least about 6% decrease of optimum exposure ($E_{op}$).

A lithography method is provided in accordance with some embodiments. The lithography method includes forming a metal-containing layer having a metal hydroxide group on a substrate, wherein the metal-containing layer includes an additive, wherein the additive is selected from the group consisting of a capping agent and a chelating ligand; treating the metal-containing layer at temperature that is lower than about 300° C. thereby causing the additive to react with the metal-hydroxyl group; forming a patterned photosensitive layer on the treated metal-containing layer; and developing the patterned photosensitive layer so as to allow at least about 6% decrease of optimum exposure ($E_{op}$).

A lithography method is provided in accordance with some embodiments. The lithography method includes forming an under layer on a substrate; forming a metal-containing middle layer on the under layer; treating the metal-containing middle layer at temperature that is lower than about 300° C. thereby reducing at least, in part, a plurality of conjugates of metal-hydroxyl group on a surface of the metal-containing layer; forming a patterned photosensitive layer on the metal-containing middle layer; and developing the patterned photosensitive layer so as to allow at least about 6% decrease of optimum exposure ($E_{op}$).

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A method comprising:
   forming a metal-containing layer on a substrate, the metal-containing layer including silicon and a metal-hydroxyl group, the metal-hydroxyl group including a metal directly bonded to oxygen and hydrogen directly bonded to the oxygen, the metal being different from silicon;
   treating the metal-containing layer at temperature that is lower than about 300° C. thereby causing a condensation reaction involving the metal-hydroxyl group that debonds the hydrogen from the oxygen, wherein the treating of the metal-containing layer includes performing a baking process on the metal-containing layer at temperature that is lower than about 300° C. during the entire baking process;
   forming a patterned photosensitive layer on the treated metal-containing layer; and
   developing the patterned photosensitive layer so as to allow at least about 6% decrease of optimum exposure ($E_{op}$).

2. The method of claim 1, wherein the treating the metal-containing layer includes baking the substrate at temperature that is greater than about 100° C.

3. The method of claim 1, wherein the metal-containing layer further includes a catalytic additive.

4. The method of claim 3, wherein the catalytic additive is configured to cause the condensation reaction in response to the treating.

5. The method of claim 3, wherein the catalytic additive is selected from a group consisting of hydrogen chloride, sulfonic acid, acetic acid, amine, ammonium salt, organometallic with organic ligands, metal oxide, metal nitride, and metal sulfide.

6. The method of claim 1, wherein the metal-containing layer is a silicon-based middle layer of a tri-layer stack for photolithography.

7. The method of claim 1, wherein the metal includes at least one material from a group consisting of: Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, Sn, Pb, Sb, Ca, Ba, and Bi.

8. A method comprising:
forming a metal-containing layer having a metal-hydroxyl group on a substrate, wherein the metal-containing layer includes silicon and an additive, wherein the additive is selected from the group consisting of a capping agent and a chelating ligand, the metal-hydroxyl group including a metal directly bonded to oxygen and hydrogen directly bonded to the oxygen, the metal being different from silicon;
treating the metal-containing layer at temperature that is lower than about 300° C. thereby causing the additive to react with the metal-hydroxyl group to debond the hydrogen from the oxygen, wherein the treating of the metal-containing layer includes performing a baking process on the metal-containing layer at temperature that is lower than about 300° C. during the entire baking process;
forming a patterned photosensitive layer on the treated metal-containing layer; and
developing the patterned photosensitive layer so as to allow at least about 6% decrease of optimum exposure (Eop).

9. The method of claim 8, wherein the additive includes at least one of the functional groups: alcohol, diol, thiol, dithiol, ethylenediaminetetraacetic acid (EDTA), amine, phosphine, alkene, alkyne, —I, —Br, —Cl, —NH2, —COOH, —OH, —SH, —N3, —S(═O)—, imine, vinyl ether, acetal, hemiacetal, ester, aldehyde, ketone, amide, sulfone, acetic acid, cyanide, ketene, isocyanate, and allene.

10. The method of claim 8, wherein the treating the metal-containing layer includes baking the substrate.

11. The method of claim 8, wherein the metal-containing layer is a silicon-based middle layer of a tri-layer stack for photolithography.

12. The method of claim 8, wherein metal-containing layer includes a blending of a silicon-based polymer, a metallic polymer, the capping agent and/or the chelating ligand.

13. The method of claim 8, wherein the reaction between the additive and the metal-hydroxyl group of the metal-containing layer includes at least one of: a replacement reaction, a condensation reaction, a $S_N2$ reaction, a $S_N1$ reaction, an E1 reaction, an E2 reaction, an oxidation reaction, a reduction reaction, a cycloaddition reaction, an elimination reaction, and a crosslinking reaction.

14. The method of claim 8, wherein the patterned photosensitive layer is an extreme ultraviolet (EUV) photoresist.

15. The method of claim 8, wherein the chelating ligand includes a chemical structure of a monodentate ligand, a bidentate ligand, a tridentate ligand, a hexadentate ligand, a polydentate ligand, or a combination hereof.

16. A lithography method, comprising:
forming an under layer on a substrate;
forming a metal-containing layer on the under layer, the metal-containing layer including silicon and a first concentration of metal-hydroxyl groups, wherein each metal hydroxyl group includes a metal directly bonded to oxygen and hydrogen directly bonded to oxygen, the metal being different from silicon;
treating the metal-containing layer at temperature that is lower than about 300° C. thereby reducing the concentration of metal-hydroxyl groups in the metal-containing layer, wherein the treating of the metal-containing layer includes performing a baking process on the metal-containing layer at temperature that is lower than about 300° C. during the entire baking process;
forming a patterned photosensitive layer on the treated metal-containing layer, wherein forming the patterned photosensitive layer on the treated metal-containing layer includes depositing a photosensitive layer on the treated metal-containing layer; and
developing the patterned photosensitive layer so as to allow at least about 6% decrease of optimum exposure (Eop).

17. The method of claim 16, wherein the treating the metal-containing layer includes forming a polymeric layer on a surface of the metal-containing layer.

18. The method of claim 17, wherein the polymeric layer includes Polyhydroxystyrene (PHS), methacrylate, polyether, silicon-containing polymers, organic polymers containing aromatic rings, or a combination hereof.

19. The method of claim 16, wherein the treating the metal-containing layer includes applying HMDS, diols, alcohols, organometallic with organic ligands, metal oxide, metal nitride, and/or metal sulfide on a surface of the metal-containing layer.

20. The method of claim 16, wherein treating of the metal-containing layer includes forming a passivation layer directly on the metal-containing layer and wherein the treating of the metal-containing layer includes performing the baking process on the passivation layer that is directly on the metal-containing layer.

* * * * *